United States Patent
Choi et al.

(10) Patent No.: US 8,283,958 B2
(45) Date of Patent: Oct. 9, 2012

(54) DELAY-LOCKED LOOP AND ELECTRONIC DEVICE INCLUDING THE SAME

(75) Inventors: Jong-Ryun Choi, Hwasung-si (KR); Dong Hwan Lee, Seongnam-si (KR); Su Ho Kim, Yongin-si (KR); Won Lee, Gunpo-si (KR); Alex Joo, Yongin-si (KR); Ji Hun Oh, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 102 days.

(21) Appl. No.: 12/659,010

(22) Filed: Feb. 23, 2010

(65) Prior Publication Data

US 2010/0219867 A1      Sep. 2, 2010

(30) Foreign Application Priority Data

Feb. 27, 2009   (KR) .................. 10-2009-0016816

(51) Int. Cl.
*H03L 7/06* (2006.01)

(52) U.S. Cl. ...................................................... 327/158
(58) Field of Classification Search .................. None
See application file for complete search history.

(56) References Cited

U.S. PATENT DOCUMENTS

| 7,928,782 B2 * | 4/2011 | Booth et al. | 327/158 |
| 2007/0030042 A1 * | 2/2007 | Kim et al. | 327/158 |
| 2008/0238507 A1 * | 10/2008 | Shim | 327/158 |

FOREIGN PATENT DOCUMENTS

| JP | 08-316325 | 11/1996 |
| JP | 2007-110620 | 4/2007 |
| JP | 2008-067365 | 3/2008 |
| KR | 1992-22699 | 12/1992 |

* cited by examiner

*Primary Examiner* — Lincoln Donovan
*Assistant Examiner* — Khareem E Almo
(74) *Attorney, Agent, or Firm* — Harness, Dickey & Pierce

(57) ABSTRACT

A delay locked loop is provided. The delay locked loop controls the number of delay cells that delay the phase of an input clock during a locking operation and controls a phase delay value of at least one delay cell among a plurality of delay cells after the locking operation is completed.

16 Claims, 18 Drawing Sheets

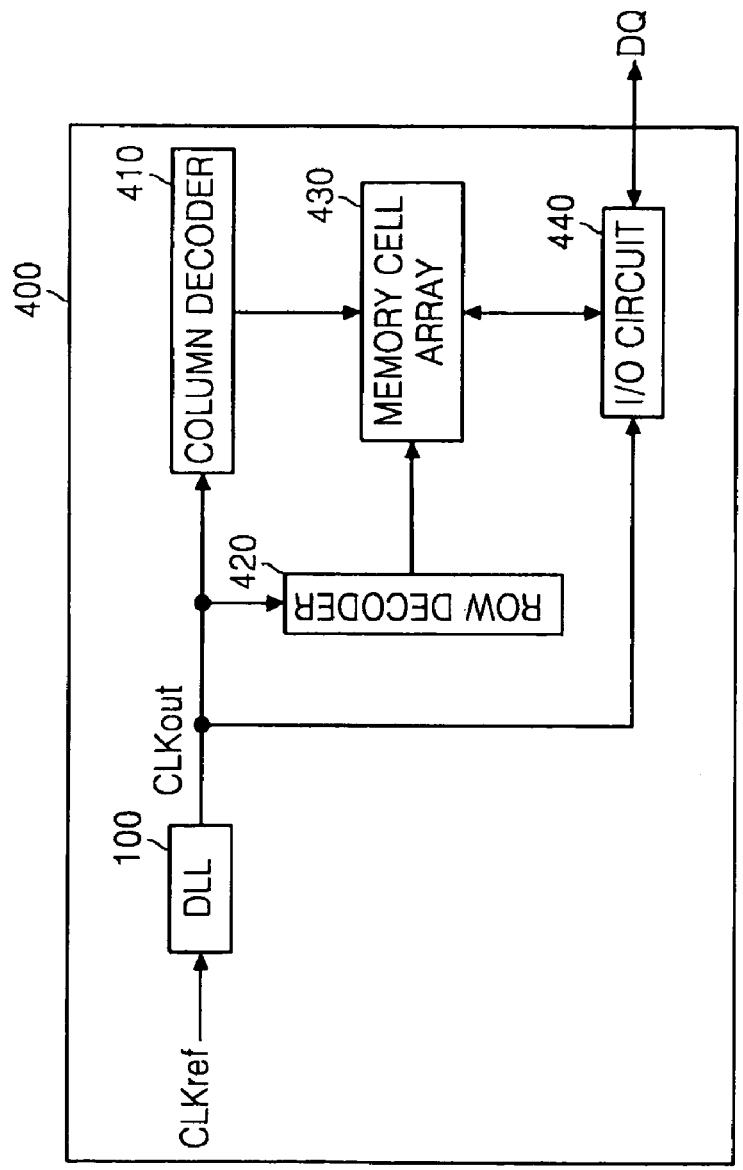

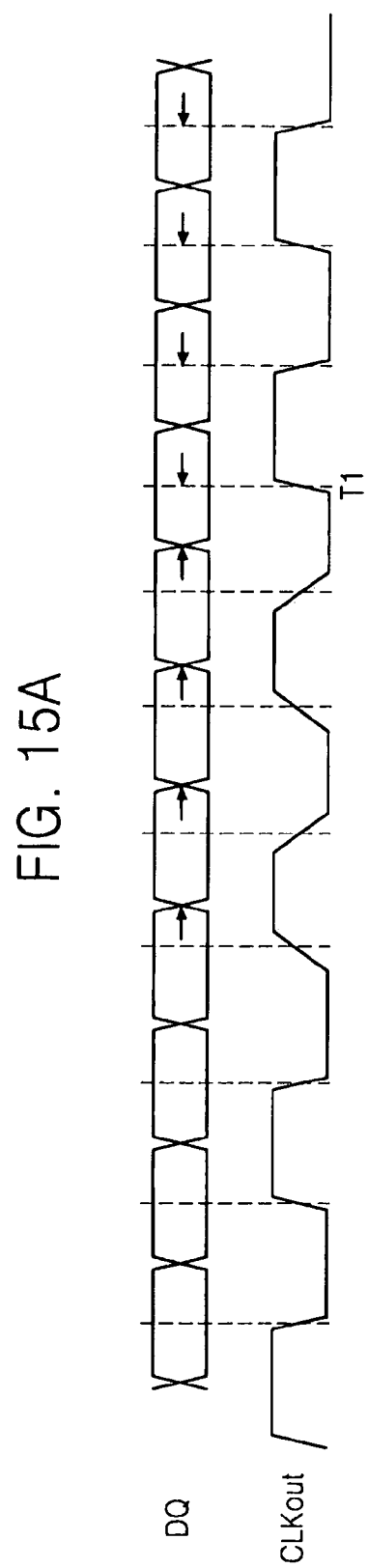

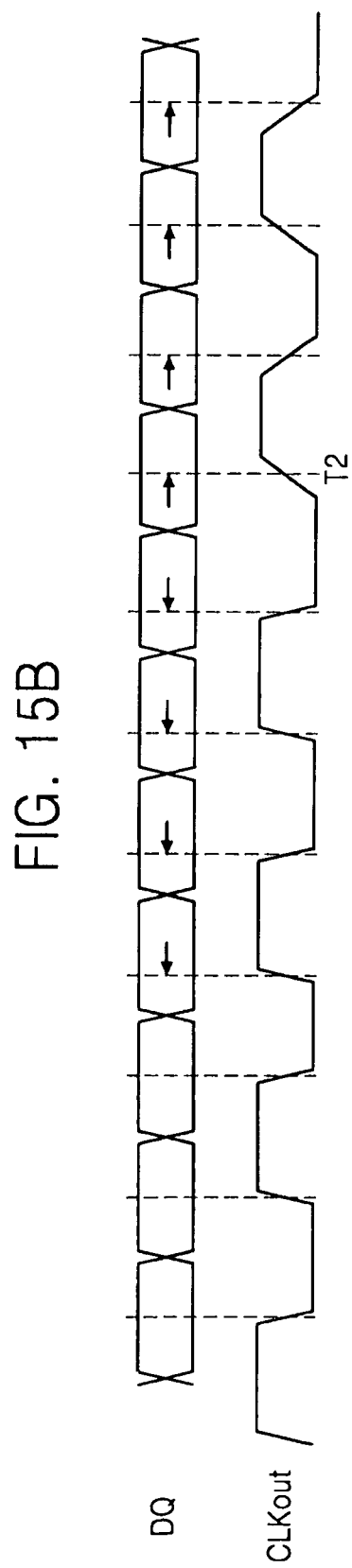

DELAY-LOCKED LOOP AND ELECTRONIC DEVICE INCLUDING THE SAME

CROSS-REFERENCE TO RELATED APPLICATIONS

This application claims priority under 35 U.S.C. §119 to Korean Patent Application No. 10-2009-0016816 filed on Feb. 27, 2009, in the Korean Intellectual Property Office (KIPO), the entire contents of which is incorporated herein by reference.

BACKGROUND

The example embodiments of inventive concepts relate to a delay-locked loop (DLL), and more particularly, to a DLL for generating an output clock signal synchronized with a reference clock signal by controlling the phase of the reference clock signal and an electronic device including the same.

A delay line control signal of a DLL using a digital delay line is usually updated while other electronic elements are not performing operations using an output clock signal generated by the DLL. For example, if the number of delay cells performing a delay operation on an input clock signal is changed, the output clock signal may be distorted due to the characteristics of the digital delay line, and consequently the electronic elements using the output clock signal may not operate properly.

Meanwhile, a delay value of the DLL may vary with the change of an external environment while the output clock signal is used by the other electronic elements. If the change of the delay value is compensated for, the electronic elements using the output clock signal can operate more accurately. For example, if the output clock signal of the DLL is used to interface with a memory device like a double data rate (DDR) memory, if the delay change of the DLL due to the change of the external environment is compensated for, the width of a valid data window can be increased, and therefore errors can be reduced during the interfacing.

SUMMARY

One or more example embodiments of the inventive concepts provide a delay-locked loop (DLL) for compensating for a delay change occurring due to the change of an external environment even while an output clock signal on which a locking operation has been completed is being used by other electronic elements and provide an electronic device including the same.

According to one or more example embodiments of the inventive concepts, a DLL including a delay line and a phase detection block is provided. The delay line may generate an output clock signal based on operations of a plurality of delay cells the plurality of delay cells may be configured to delay a phase of a first (e.g., reference or a clock received from an adjacent delay cell) clock signal. The phase detection block may be configured to detect a phase difference between the first clock signal and the output clock signal. The phase detection block may also be configured to generate a plurality of first control signals and a plurality of second control signals based on the phase difference.

The number of the plurality of delay cells may be configured to generate the output clock signal from the first clock signal in response to the plurality of first control signals during a locking operation and a phase delay value of at least one delay cell of the plurality of delay cells may be controlled in response to the plurality of second control signals after the locking operation is completed.

The at least one delay cell may include a delay element and a first delay control block. The delay element may be configured to delay the phase of the first clock signal by a predetermined value. The first delay control block may control a transition speed of the first clock signal input to an input terminal of the delay element in response to a corresponding second control signal of the plurality of second control signals.

The first delay control block may include a first current path between an input terminal of the delay element and a first voltage (e.g., power supply) terminal, the first current path being switched in response to the first of the plurality of second control signals. The first delay control block may include a plurality of switches electrically connected between the input terminal of the delay element and the first voltage terminal and each of the plurality of switches is configured to operate in response to the input clock or the corresponding second control signal.

The at least one delay cell may further include a second delay control block configured to control a transition speed of a second clock signal output through an output terminal of the delay element in response to a corresponding second control signal of the plurality of second control signals.

The second delay control block may include a second current path between the output terminal of the delay element and a second voltage (e.g., power supply) terminal, the second current path being switched in response to the corresponding second control signal. The second delay control block may include a plurality of switches electrically connected between the output terminal of the delay element and the second voltage terminal and each of the plurality of switches may be configured to operate in response to the input clock or the corresponding second control signal.

The at least one delay cell may include an inverter, a plurality of first transistors, and a plurality of second transistors. The inverter may invert an input clock. The plurality of first transistors may be electrically connected between an input terminal of the inverter and a first voltage (e.g., power supply) terminal and each of the plurality of first transistors may perform a switching operation in response to a clock signal or a corresponding second control signal of the plurality of second control signals. The plurality of second transistors may be electrically connected between an output terminal of the inverter and a second voltage (e.g., power supply) terminal and each of the plurality of second transistors may perform a switching operation in response to a clock or a corresponding second control signal among the plurality of second control signals.

The plurality of first transistors may include a transistor electrically connected between the input terminal of the inverter and a first node and operating in response to a clock output from the inverter, a transistor electrically connected between the first node and a second node and operating in response to the input clock, and a transistor electrically connected between the second node and the first voltage terminal and operating the corresponding second control signal.

The plurality of second transistors may include a transistor electrically connected between the output terminal of the inverter and a third node and operating in response to the input clock, a transistor electrically connected between the third node and a fourth node and operating in response to the clock output from the inverter, and a transistor electrically connected between the fourth node and the second voltage terminal and operating the corresponding second control signal.

According to one or more, example embodiments of the inventive concepts a delay locked loop may include a plurality of delay cells that may be configured to generate an output clock signal based on a phase delayed first clock signal, a plurality of first control signals and a phase delay value of at least one delay cell of the plurality of delay cells during a locking operation. The plurality of delay cells may be configured to generate the output clock signal based on the phase delayed first clock signal and a plurality of second control signals after the locking operation is complete.

The DLL may be used in an electronic device including an element which receives the output clock signal and operates in response to the output clock signal.

BRIEF DESCRIPTION OF THE DRAWINGS

Example embodiments of the inventive concepts will be more clearly understood from the following brief description taken in conjunction with the accompanying drawings. FIGS. 1-17 represent non-limiting, example embodiments as described herein.

FIG. 1 is a block diagram of a delay-locked loop (DLL) according to an example embodiment of the present inventive concept.

FIG. 2 is a diagram of the structure of a delay line illustrated in FIG. 1.

FIG. 3 is a circuit diagram of a unit delay cell illustrated in FIG. 2.

FIG. 4 is a graph showing a delay control period of a first delay control block illustrated in FIG. 3.

FIG. 5 is a graph showing a delay control operation of the first delay control block illustrated in FIG. 3.

FIG. 6 is a graph showing the simulation result of delay control of the first delay control block illustrated in FIG. 3.

FIG. 7 is a graph showing a delay control operation performed by a pair of first delay control blocks according to an exemplary embodiment of the present inventive concept.

FIG. 8 is a graph showing a delay control period of a second delay control block illustrated in FIG. 3.

FIG. 9 is a graph showing a delay control operation of the second delay control block illustrated in FIG. 3.

FIG. 10 is a graph showing the simulation result of delay control of the second delay control block illustrated in FIG. 3.

FIG. 11 is a graph showing a delay control operation performed by a pair of second delay control blocks according to an example embodiment of the present inventive concept.

FIG. 12 is a block diagram of a DLL according to other example embodiments of the present inventive concept.

FIG. 13 is a block diagram of a DLL according to further example embodiments of the present inventive concept.

FIG. 14 is a block diagram of a memory device according to an example embodiment of the present inventive concept.

FIGS. 15A and 15B are diagrams showing an operation of securing a margin between input/output data of the memory device illustrated in FIG. 14 and a clock signal used as a timing clock signal.

FIG. 16 is a schematic diagram roughly illustrating a memory card 500 according to an example embodiment of the present inventive concept.

FIG. 17 is a block diagram roughly illustrating an electronic system 600 according to an example embodiment of the present inventive concept.

Figure 1:
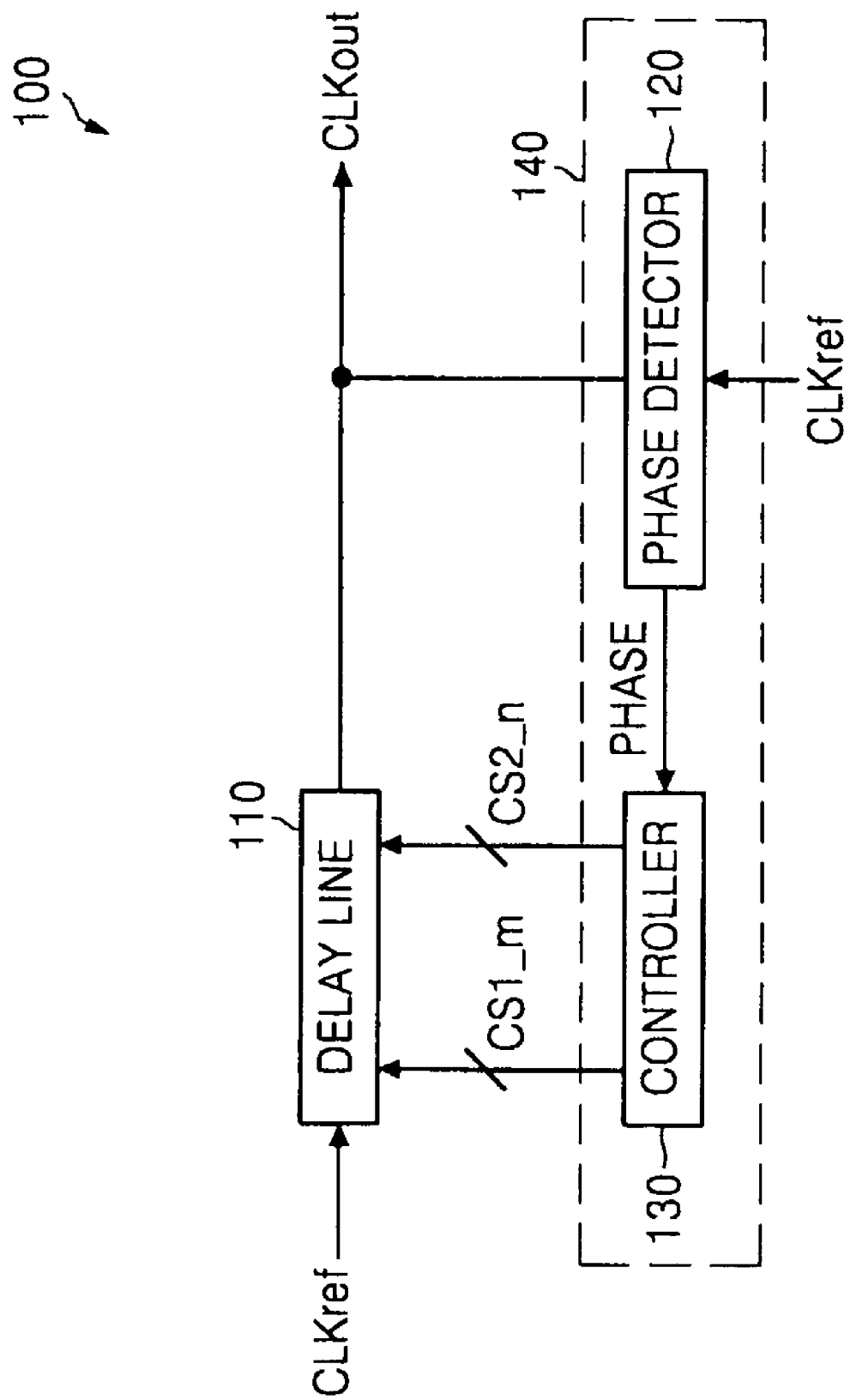

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments of inventive concepts will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a delay-locked loop (DLL) 100 according to an example embodiment of the inventive concepts. The DLL 100 includes a delay line 110 and a phase detection block 140. The delay line 110 may include a plurality of delay cells (not shown) each of which delays the phase of a reference clock signal CLKref or the phase of a clock signal input from an adjacent delay cell. The delay line 110 generates an output clock signal CLKout based on the operations of the delay cells.

The phase detection block 140 detects a phase difference PHASE between the reference clock signal CLKref and the output clock signal CLKout and generates a plurality of first control signals CS1_m and a plurality of second control signals CS2_n based on the phase difference PHASE. The phase detection block 140 includes a phase detector 120 and a controller 130. The phase detector 120 detects and outputs the phase difference PHASE between the reference clock signal CLKref and the output clock signal CLKout and the controller 130 generates the plurality of first control signals CS1_m and the plurality of second control signals CS2_n based on the phase difference PHASE.

When the phase difference PHASE is within a predetermined range, the controller 130 may determine that a locking operation for the synchronization of the output clock signal CLKout with an input clock signal, e.g., the reference clock signal CLKref has been completed. When the phase difference PHASE is not in the predetermined range, the controller 130 may generate the first control signals CS1_m used to carry out the locking operation.

During the locking operation, the DLL 100 may control the number of delay cells used in generating the output clock signal CLKout from the reference clock signal CLKref in response to the first control signals CS1_m. For example, the DLL 100 may control the number of delay cells used in generating the output clock signal CLKout by selectively outputting clocks from delay cells because the clocks output from the delay cells have different phase differences from the reference clock signal CLKref.

If the locking operation is completed, the output clock signal CLKout may be used as a signal based on which other electronic elements operate (e.g., a timing signal of a memory device). Hereinafter, a period during which the output clock signal CLKout is used by other electronic elements is referred to as an "output clock function period". Even during the output clock function period, a delay change with respect to the output clock signal CLKout may occur due to the change of an external environment.

The phase difference PHASE between the output clock signal CLKout and the reference clock signal CLKref may be detected by the phase detector 120. The controller 130 may generate the second control signals CS2_n for controlling a phase delay value of at least one delay cell among the plurality of delay cells based on the phase difference PHASE.

In other words, the DLL 100 may compensate for the delay change occurring due to the change of the external environment by controlling the phase delay value of a delay cell without controlling the number of operating delay cells even during the output clock function period.

Figure 2:
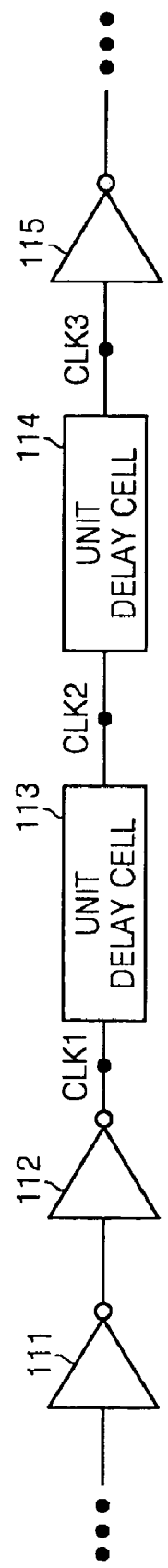

FIG. 2 is a diagram of the structure of the delay line 110 illustrated in FIG. 1. Referring to FIG. 2, the delay line 110 may include delay cells 111 through 115. The delay cells 111 through 115 may have a same value or may have different delay values. The delay cells 111 through 115 may include the delay cells 111, 112, and 115 that include only a delay element and the unit delay cells 113 and 114 that include a delay control block (not shown) controlling a delay value of the delay element. As illustrated in FIG. 2, the delay element may be implemented by an inverter. Although not shown, the DLL 100 may generate a plurality of clocks, e.g., CLK1-CLK3, having different phases by selectively outputting a clock output from each delay cell.

Figure 3:
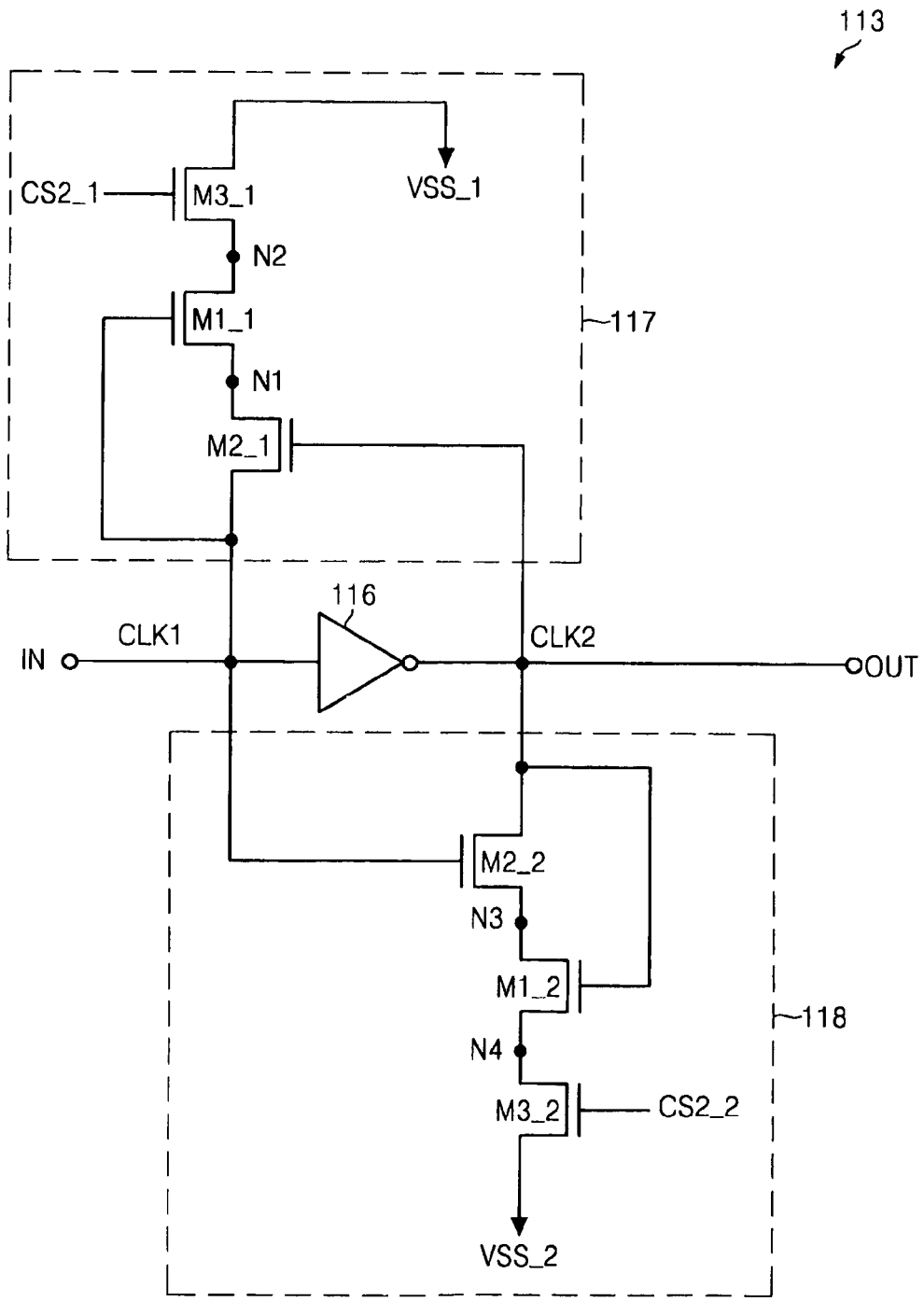

FIG. 3 is a circuit diagram of the unit delay cell 113 illustrated in FIG. 2. Referring to FIG. 3, the unit delay cell 113 may include a delay element 116, a first delay control block 117, and a second delay control block 118.

The delay element 116 may delay the phase of a clock CLK1 input thereto by a predetermined value and may be implemented by an inverter. The first delay control block 117 may control the transition speed of the clock CLK1 input to an input terminal IN of the delay element 116 in response to a corresponding second control signal, e.g., CS2_1 among the second control signals CS2_n as described above with regard to FIG. 1.

The first delay control block 117 may include a first current path formed between the input terminal IN of the delay element 116 and a voltage terminal VSS_1 in response to the second control signal CS2_1. The voltage terminal VSS_1 may be associated with a voltage power supply or a ground voltage. The first delay control block 117 may be connected between the input terminal IN of the delay element 116 and the voltage terminal VSS_1 and may include a plurality of switches M1_1, M2_1, and M3_1 each operating in response to a clock or the second control signal CS2_1. As illustrated in FIG. 3, the switches M1_1 through M3_1 may be implemented by a first transistor group that is connected between the input terminal IN of the inverter 116 and the voltage terminal VSS_1 and may perform a switching operation in response to the clocks and the second control signal CS2_1.

The first transistor group may include a first transistor M1_1, a second transistor M2_1, and a third transistor M3_1. The first transistor M1_1 may be connected between a first node N1 and a second node N2 and may operate in response to the clock CLK1 input to the inverter 116. The second transistor M2_1 may be connected between the input terminal IN of the inverter 116 and the first node N1 and may operate in response to a clock CLK2 output from the inverter 116. The third transistor M3_1 may be connected between the second node N2 and the voltage terminal VSS_1 and may operate in response to the second control signal CS2_1.

The second delay control block 118 may control the transition speed of the clock CLK2 output to an output terminal OUT of the delay element 116 in response to a corresponding second control signal, e.g., CS2_2 among the second control signals CS2_n as described above with regard to FIG. 1. The second delay control block 118 may include a second current path formed between the output terminal OUT of the delay element 116 and a voltage terminal VSS_2 in response to the second control signal CS2_2. The voltage terminal VSS_2 may be associated with a voltage power supply or a ground voltage. The second delay control block 118 may be connected between the output terminal OUT of the delay element 116 and the voltage terminal VSS_2 and may include a plurality of switches M1_2, M2_2, and M3_2 each operating in response to a clock or the second control signal CS2_2. As illustrated in FIG. 3, the switches M1_2 through M3_2 may be implemented by a second transistor group that is connected between the output terminal OUT of the inverter 116 and the voltage terminal VSS_2 and may perform a switching operation in response clocks and the second control signal CS2_2.

The second transistor group may include a first transistor M1_2, a second transistor M2_2, and a third transistor M3_2. The first transistor M1_2 may be connected between a third node N3 and a fourth node N4 and may operate in response to the clock CLK2 output from the inverter 116. The second transistor M2_2 may be connected between the output terminal OUT of the inverter 116 and the third node N3 and may operate in response to the clock CLK1 input to the inverter 116. The third transistor M3_2 may be connected between the fourth node N4 and the voltage terminal VSS_2 and may operate in response to the second control signal CS2_2.

The first delay control block 117 may control a rising time of the input clock CLK1 using a current path formed between the input terminal IN of the delay element 116 and the voltage terminal VSS_1 in the embodiments illustrated in FIG. 3, but example embodiments of the inventive concepts are not restricted to the current example embodiments. For example, the first delay control block 117 may be implemented to control the transition speed of the input clock CLK1 using a current path formed between the input terminal IN of the delay element 116 and a voltage terminal, e.g., VSS_1.

The second delay control block 118 may control a falling time of the clock CLK2 output from the delay element 116 using a current path formed between the output terminal OUT of the delay element 116 and the voltage terminal VSS_2 in the example embodiments illustrated in FIG. 3, but example embodiments of the inventive concepts are not restricted to the current example embodiments. For example, the second delay control block 118 may be implemented to control the transition speed of the clock CLK2 output from the delay element 116 using a current path formed between the output terminal OUT of the delay element 116 and a voltage terminal, e.g., VSS_2.

Figure 4:
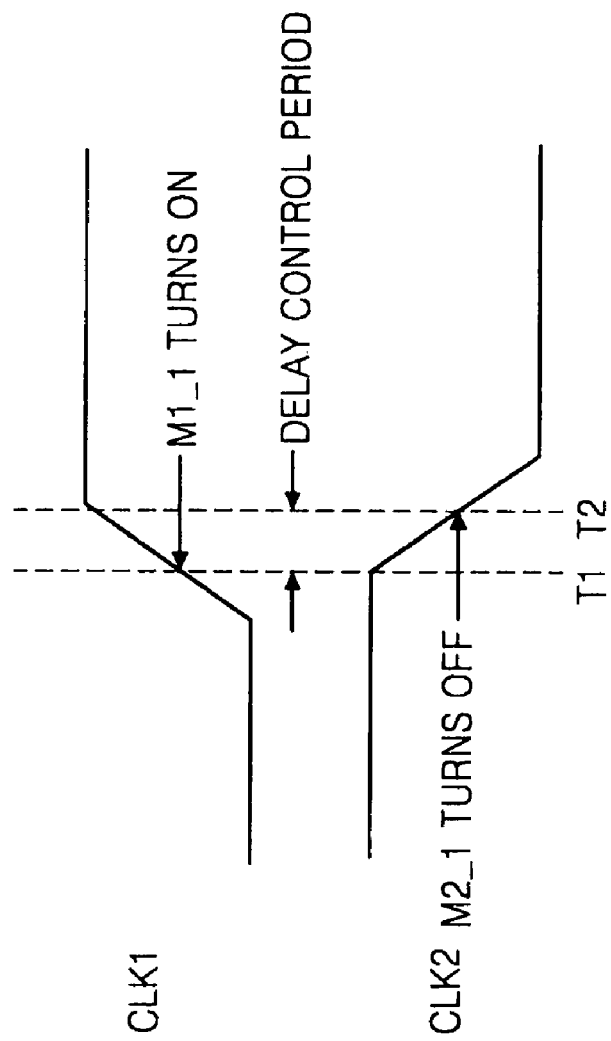

FIG. 4 is a graph showing a delay control period of the first delay control block 117 as illustrated in FIG. 3. The delay control period of the first delay control block 117 will be described with reference to FIGS. 3 and 4 below.

If the input clock CLK1 is at a low state, the first transistor M1_1 may be off and the second transistor M2_1 may be on. At time point T1 if the input clock CLK1 reaches the threshold voltage of the first transistor M1_1 after starting to increase, the first transistor M1_1 may turn on.

If the first transistor M1_1 turns on, the output clock CLK2 may start to decrease. At time point T2 if the output clock CLK2 reaches the threshold voltage of the second transistor M2_1, the second transistor may turn off and thus interrupts the current path between the input terminal IN and the voltage terminal VSS_1.

Therefore, delay control by the first delay control block 117 may be performed through the current path formed during a period from time point T1 to time point T2 while both of the first and second transistors M1_1 and M2_1 are on in a state where the third transistor M3_1 is on in response to the second control signal CS2_1.

Figure 5:
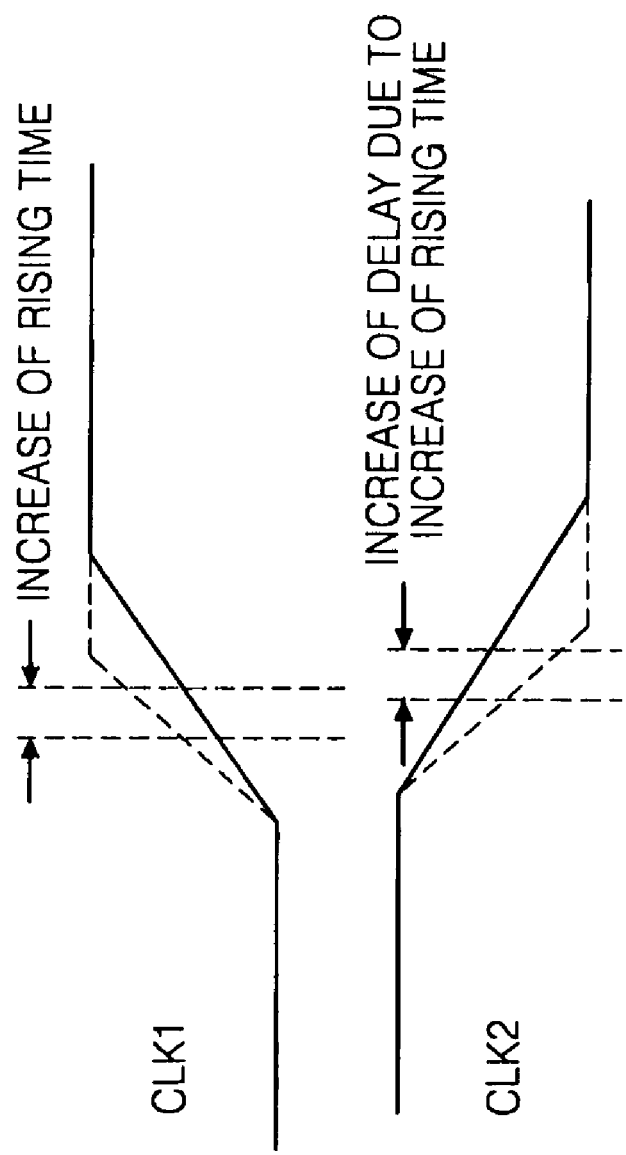

FIG. 5 is a graph showing a delay control operation of the first delay control block 117 as illustrated in FIG. 3. The delay control operation of the first delay control block 117 will be described with reference to FIGS. 3 through 5 below.

If the first and second transistors M1_1 and M2_1 turn on in a state where the third transistor M3_1 is on in response to the second control signal CS2_1, a current path may exist between the input terminal IN and the voltage terminal VSS_1. Due to the current path between the input terminal IN and the voltage terminal VSS_1, the rising time of the input clock CLK1 may increase, and therefore, the delay of the clock CLK2 output through the inverter 116 may also increase.

Figure 6:
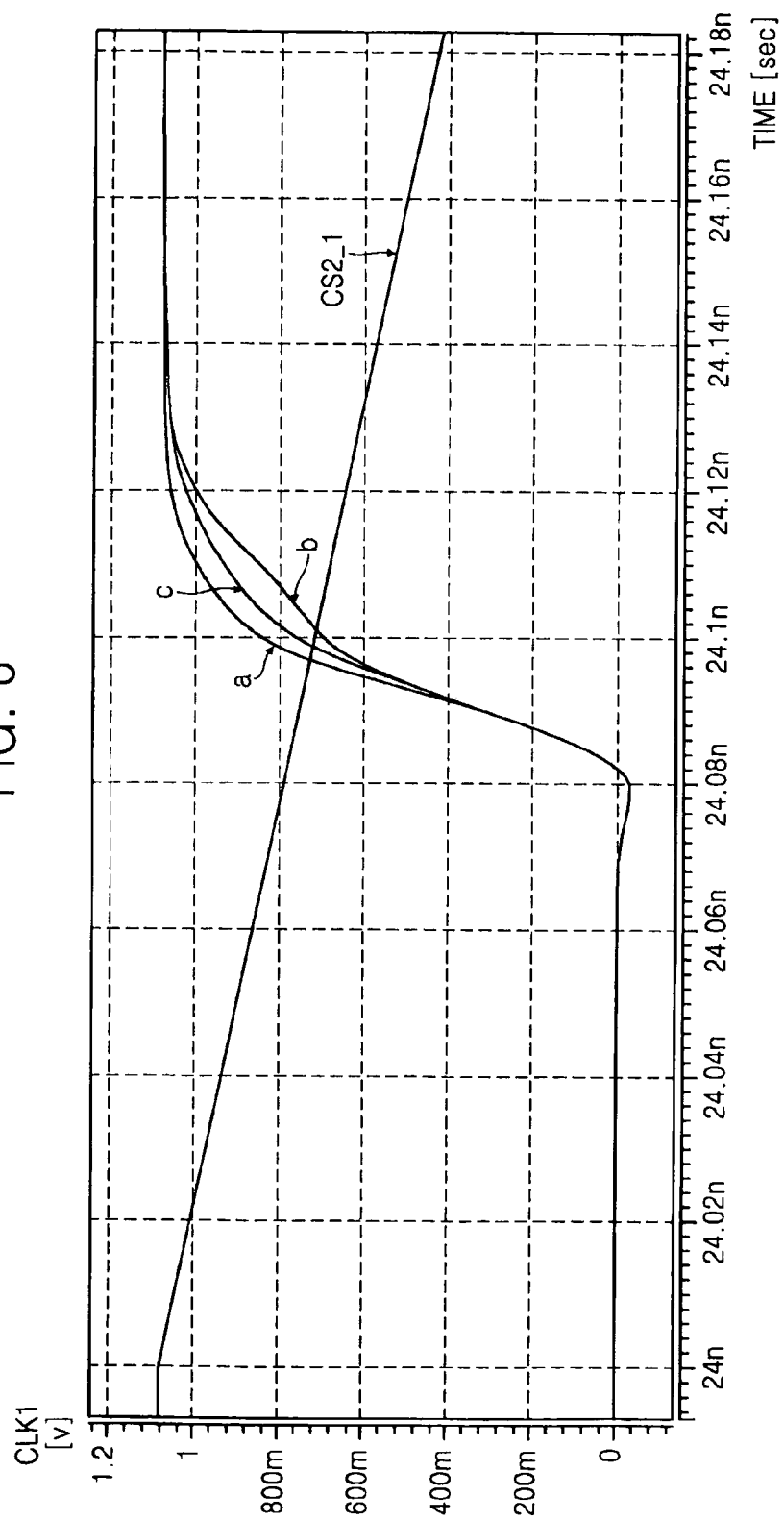

FIG. 6 is a graph showing a simulation result of delay control of the first delay control block 117 illustrated in FIG. 3. The curve "a" shows the input clock CLK1. The curve "b" shows a clock with rising time increased by the first delay control block 117. The curve "c" shows a clock with rising time increasing during a transition of the second control signal CS2_1 as described above. The delay control operation of the first delay control block 117 may be performed even during the transition of the second control signal CS2_1 although the increment of the rising time of the input clock CLK1 decreases.

As described above with reference to FIGS. 3 through 6, the first delay control block 117 may increase only the rising time of the input clock CLK1. In other words, if only one first delay control block 117 is used, a clock having increased rising time at only a single transition included in a single cycle of the input clock CLK1 may be generated. Accordingly, to increase the amount of delay throughout the single cycle of the input clock CLK1, a pair of first delay control blocks 117 may be required.

Figure 7:
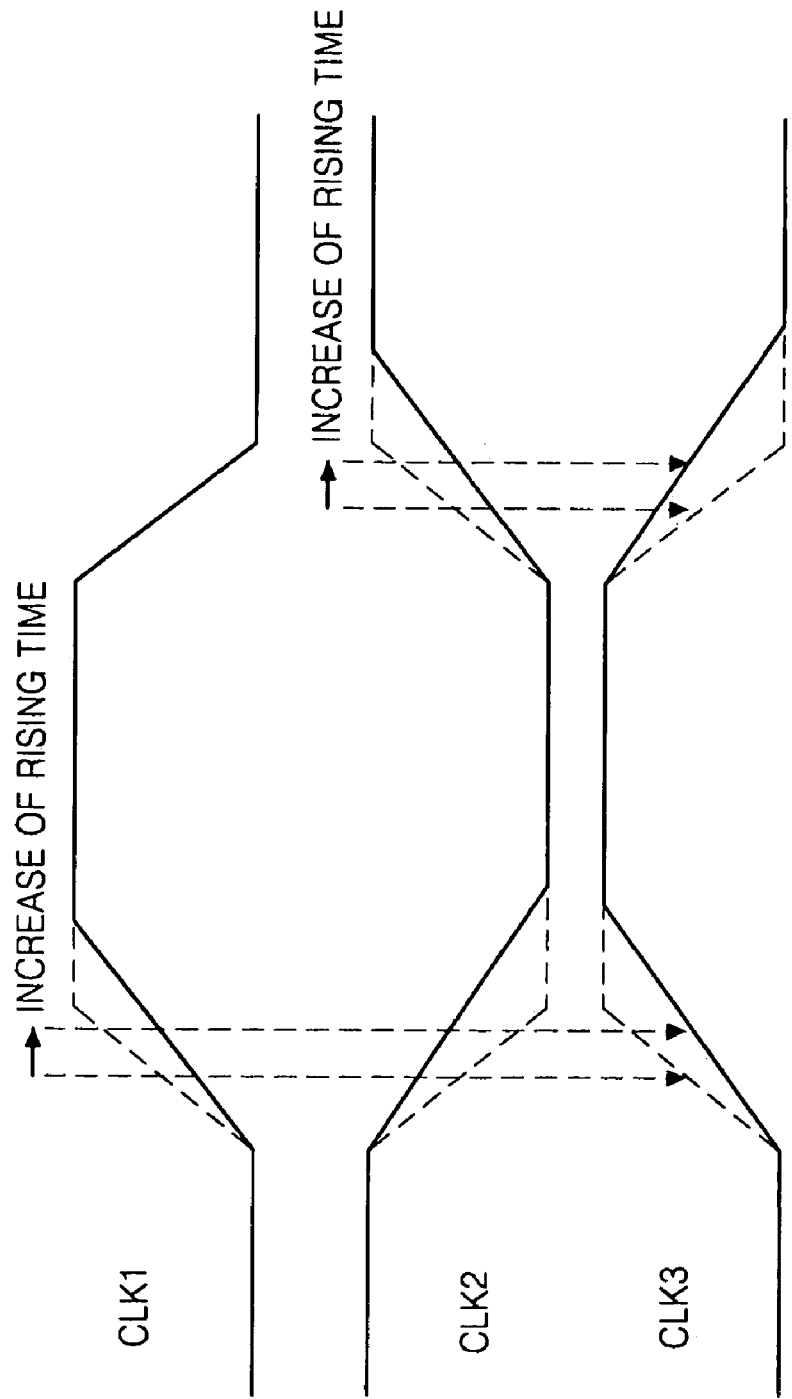

FIG. 7 is a graph showing a delay control operation performed by a pair of first delay control blocks according to an example embodiment of the inventive concept. The delay control operation illustrated in FIG. 7 is performed by the first delay control blocks respectively included in the unit delay cells 113 and 114 as illustrated in FIG. 2. The delay control operation performed by the two first delay control blocks will be described in order with reference to FIGS. 3 and 7 below.

The rising time of the input clock CLK1 may be increased by the first delay control block 117 included in the unit delay cell 113. The falling time of the input clock CLK1 does not change. The input clock CLK1 with the increased rising time may be inverted by the inverter 116.

The rising time of the clock CLK2 output from the inverter 116 may be increased by the first delay control block included in the unit delay cell 114. The falling time of the clock CLK2 corresponding to an inverted clock of the input clock CLK1 may not change. Consequently, the increase of delay may be accomplished at both two transitions included in a single cycle of the input clock CLK1 by the two first delay control blocks respectively included in the unit delay cells 113 and 114. FIG. 7 shows that a clock CLK3 output from an inverter inverting the clock CLK2 in the unit delay cell 114 may be a clock obtained after the increase of delay is accomplished at both of the two transitions included in the single cycle of the input clock CLK1.

Figure 8:
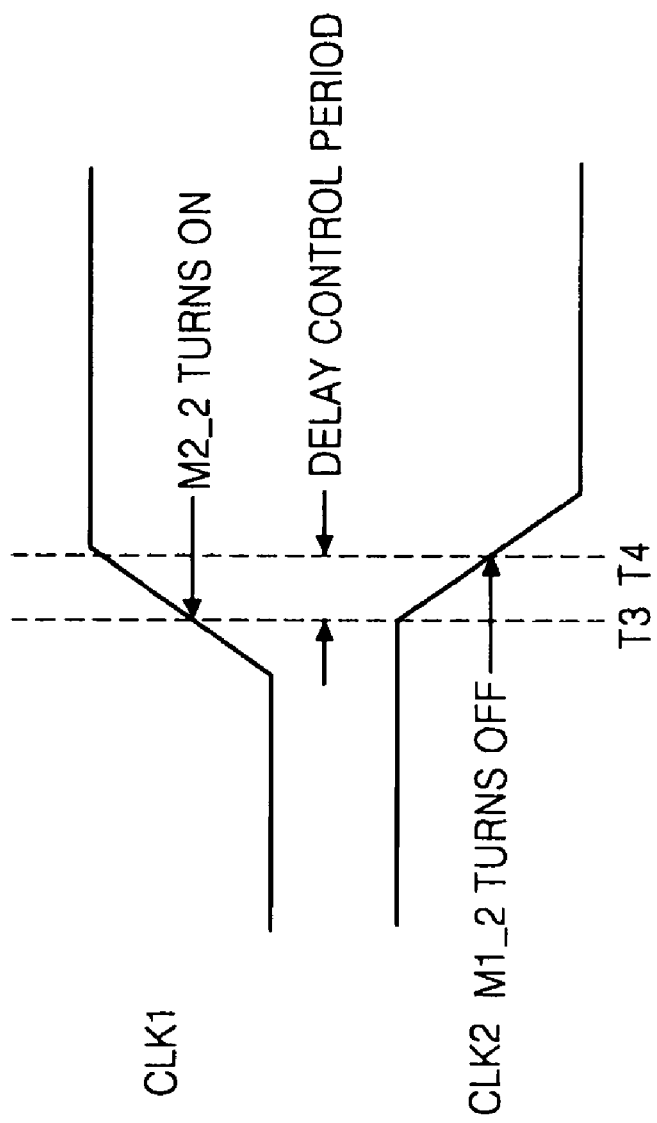

FIG. 8 is a graph showing a delay control period of the second delay control block 118 illustrated in FIG. 3. The delay control period of the second delay control block 118 will be described with reference to FIGS. 3 and 8 below.

If the input clock CLK1 is at the low state, the second transistor M2_2 may be off and the first transistor M1_2 may be on. At time point T3 if the input clock CLK1 reaches the threshold voltage of the second transistor M2_2 after starting to increase, the second transistor M2_2 may turn on.

If the second transistor M2_2 turns on, the output clock CLK2 may start to decrease. At time point T4 if the output clock CLK2 reaches the threshold voltage of the first transistor M1_2, the first transistor may turn off and thus interrupt a current path between the output terminal OUT and the voltage terminal VSS_2.

Therefore, delay control by the second delay control block 118 may be performed through the current path formed during a period from time point T3 to time point T4 while both of the first and second transistors M1_2 and M2_2 are on in a state where the third transistor M3_2 is on in response to the second control signal CS2_2.

Figure 9:
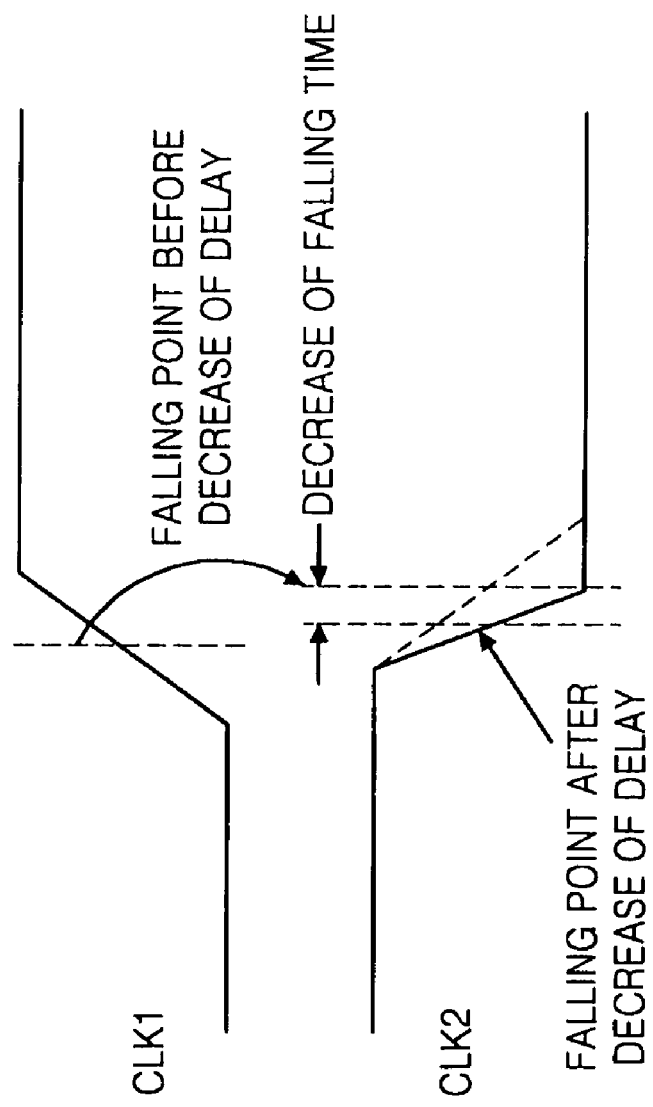

FIG. 9 is a graph showing a delay control operation of the second delay control block 118 illustrated in FIG. 3. The delay control operation of the second delay control block 118 will be described with reference to FIGS. 3 and 9 below.

If the first and second transistors M1_2 and M2_2 turn on in a state where the third transistor M3_2 is on in response to the second control signal CS2_2, a current path may exist between the output terminal OUT and the voltage terminal VSS_2. Due to the current path between the output terminal OUT and the voltage terminal VSS_2, the falling time of the output clock CLK2 may decrease, and therefore the delay of the clock CLK2 output through the inverter 116 may also decrease.

Figure 10:
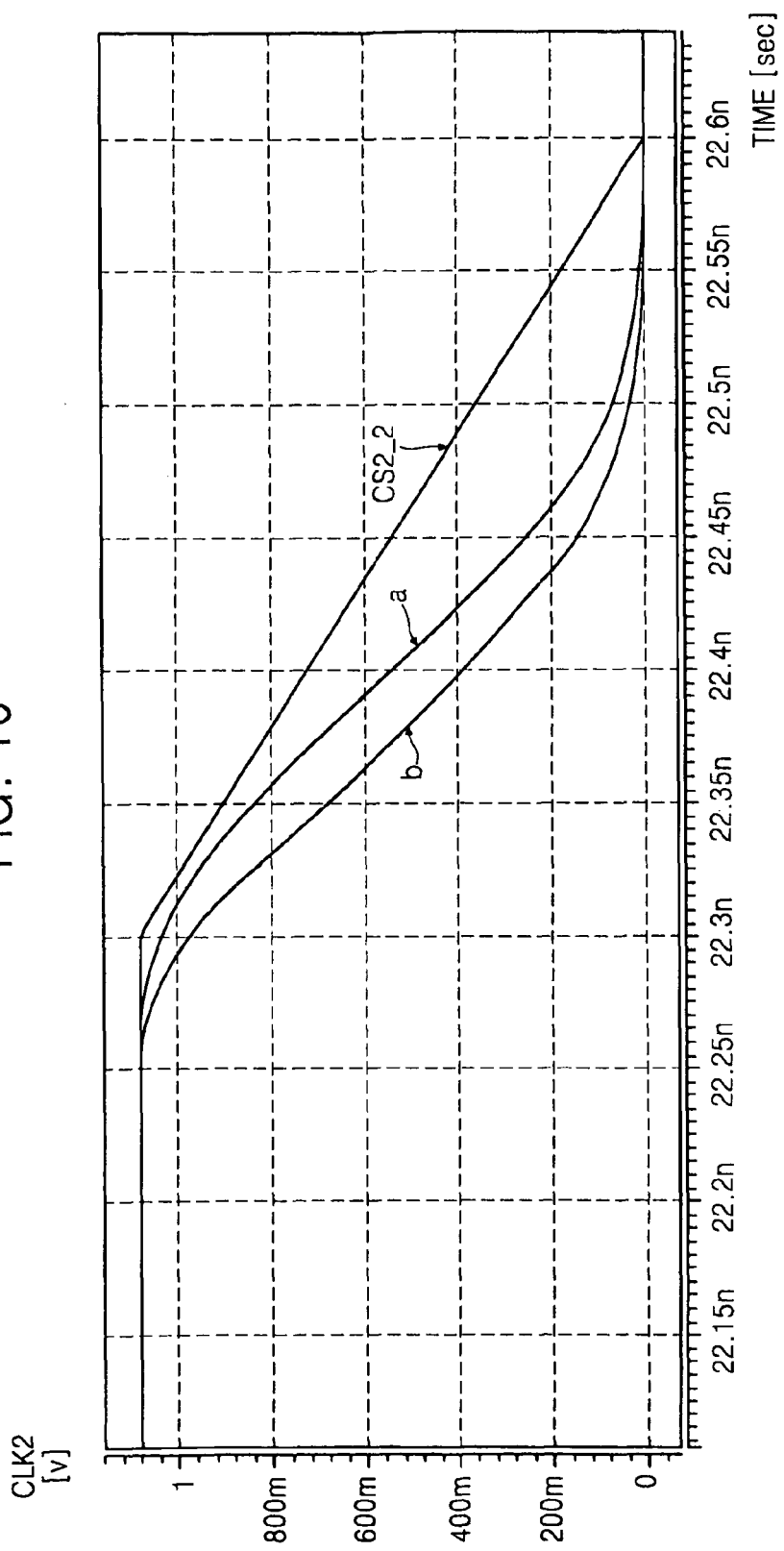

FIG. 10 is a graph showing the simulation result of delay control of the second delay control block 118 illustrated in FIG. 3. The curve "a" shows the input clock CLK1. The curve "b" shows a clock with falling time decreased by the second delay control block 118 during a transition of the second control signal CS2_2. The delay control operation of the second delay control block 118 may be performed even during the transition of the second control signal CS2_2.

As described above with reference to FIG. 3 and FIGS. 8 through 10, the second delay control block 118 may decrease only the falling time of the input clock CLK1. In other words, if only one second delay control block 118 is used, a clock having decreased falling time at only a single transition included in a single cycle of the input clock CLK1 may be generated. Accordingly, to decrease the amount of delay throughout the single cycle of the input clock CLK1, a pair of second delay control blocks 118 may be required.

Figure 11:
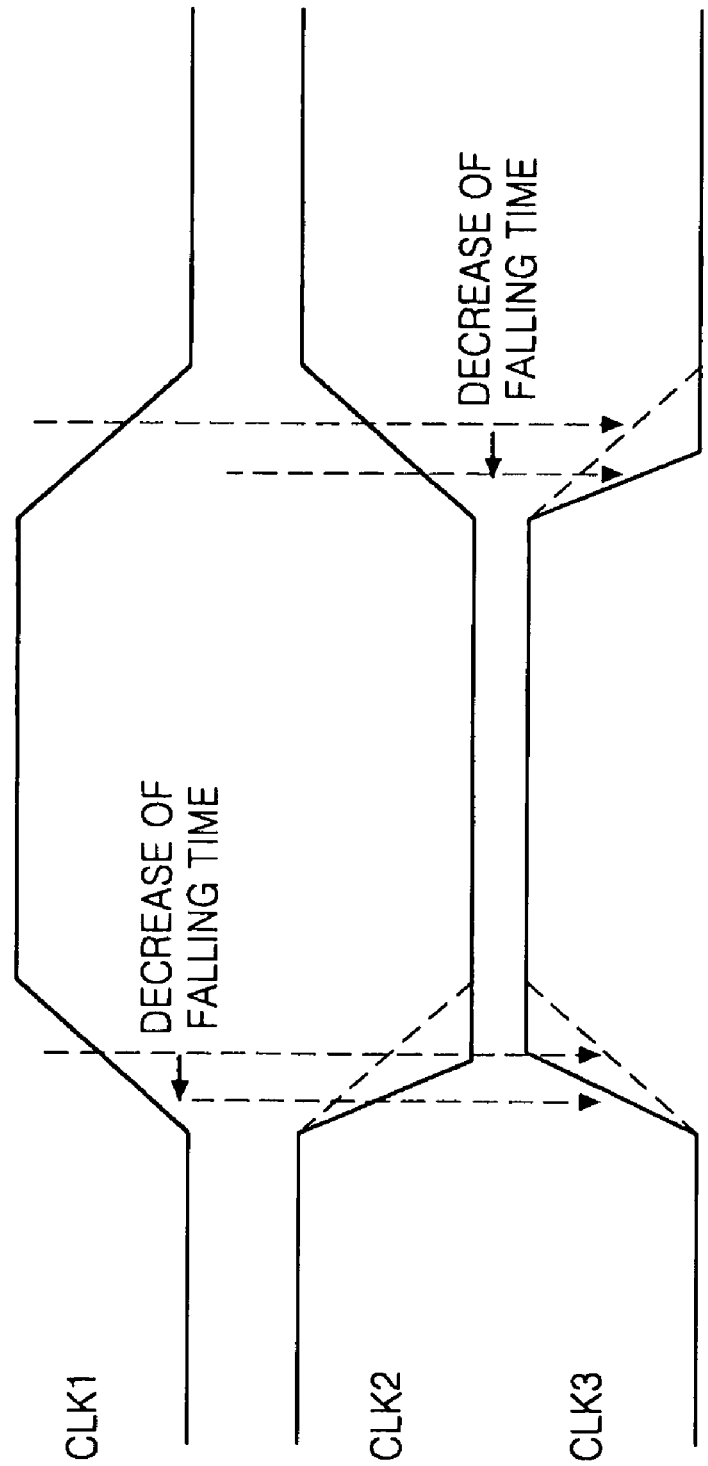

FIG. 11 is a graph showing a delay control operation performed by a pair of second delay control blocks according to an example embodiment of the inventive concept. The delay control operation illustrated in FIG. 11 may be performed by the second delay control blocks included in the unit delay cells 113 and 114 illustrated in FIG. 2. The delay control operation performed by the two second delay control blocks will be described in order with reference to FIGS. 3 and 11 below.

The falling time of the output clock CLK2 may be decreased by the second delay control block 118 included in the unit delay cell 113. The rising time of the output clock CLK2 may not change.

The falling time of the clock CLK3 output from an inverter included in the unit delay cell 114 may be decreased by the second delay control block included in the unit delay cell 114. The rising time of the clock CLK3 corresponding to an inverted clock of the clock CLK2 input to the unit delay cell 114 may not change. Consequently, the decrease of delay may be accomplished at both two transitions included in a single cycle of the input clock CLK1 by the two second delay control blocks respectively included in the unit delay cells 113 and 114. FIG. 11 shows that the clock CLK3 output from the unit delay cell 114 may be a clock obtained after the decrease of delay is accomplished at both of the two transitions included in the single cycle of the input clock CLK1.

Figure 12:
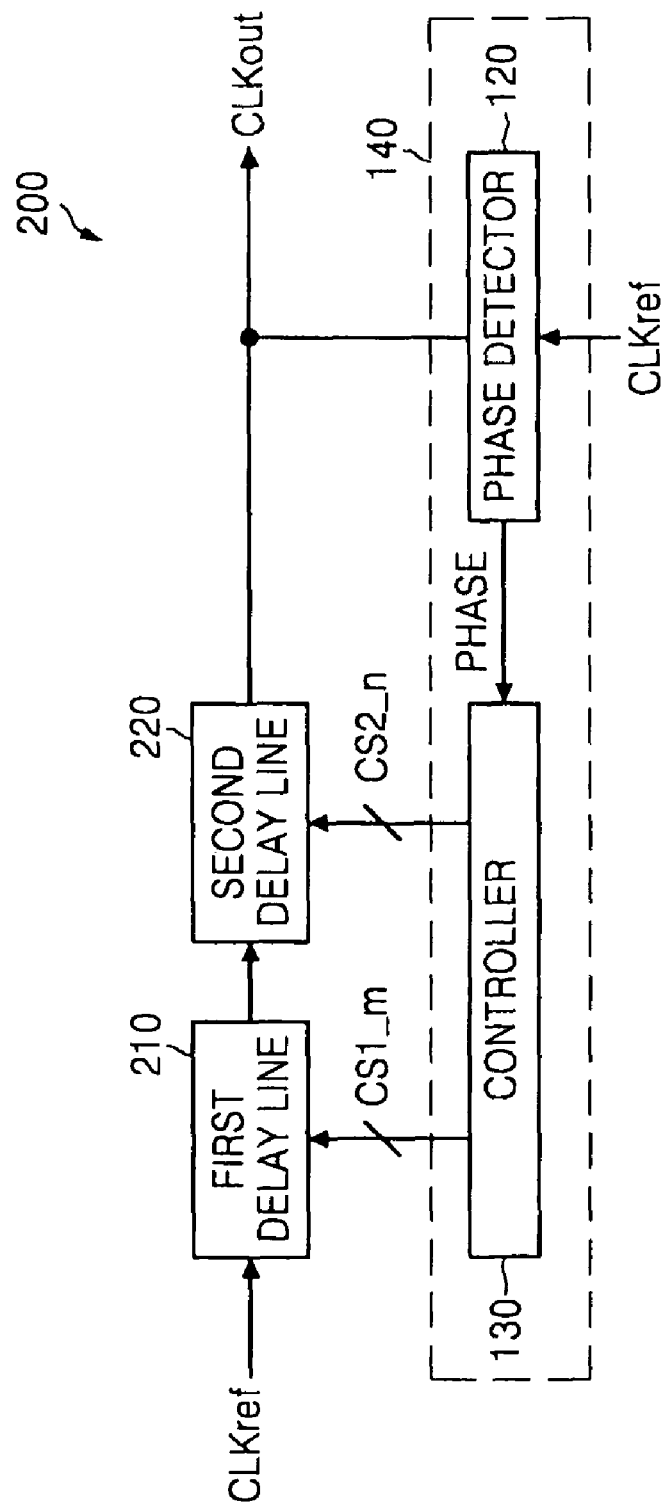

FIG. 12 is a block diagram of a DLL 200 according to another example embodiment of the inventive concepts. The DLL 200 has the same structure as the DLL 100 as illustrated in FIG. 1 except for the structure of a delay line. Thus, the difference therebetween will only be described.

The delay line of the DLL 200 may include a first delay line 210 and a second delay line 220. The first delay line 210 may include delay cells (not shown) that do not include a delay control block and the second delay line 220 may include both a delay element and a delay control block. The first delay line 210 may be controlled by a plurality of first control signals CS1_m and the second delay line 220 may be controlled by a plurality of second control signals CS2_n.

Figure 13:
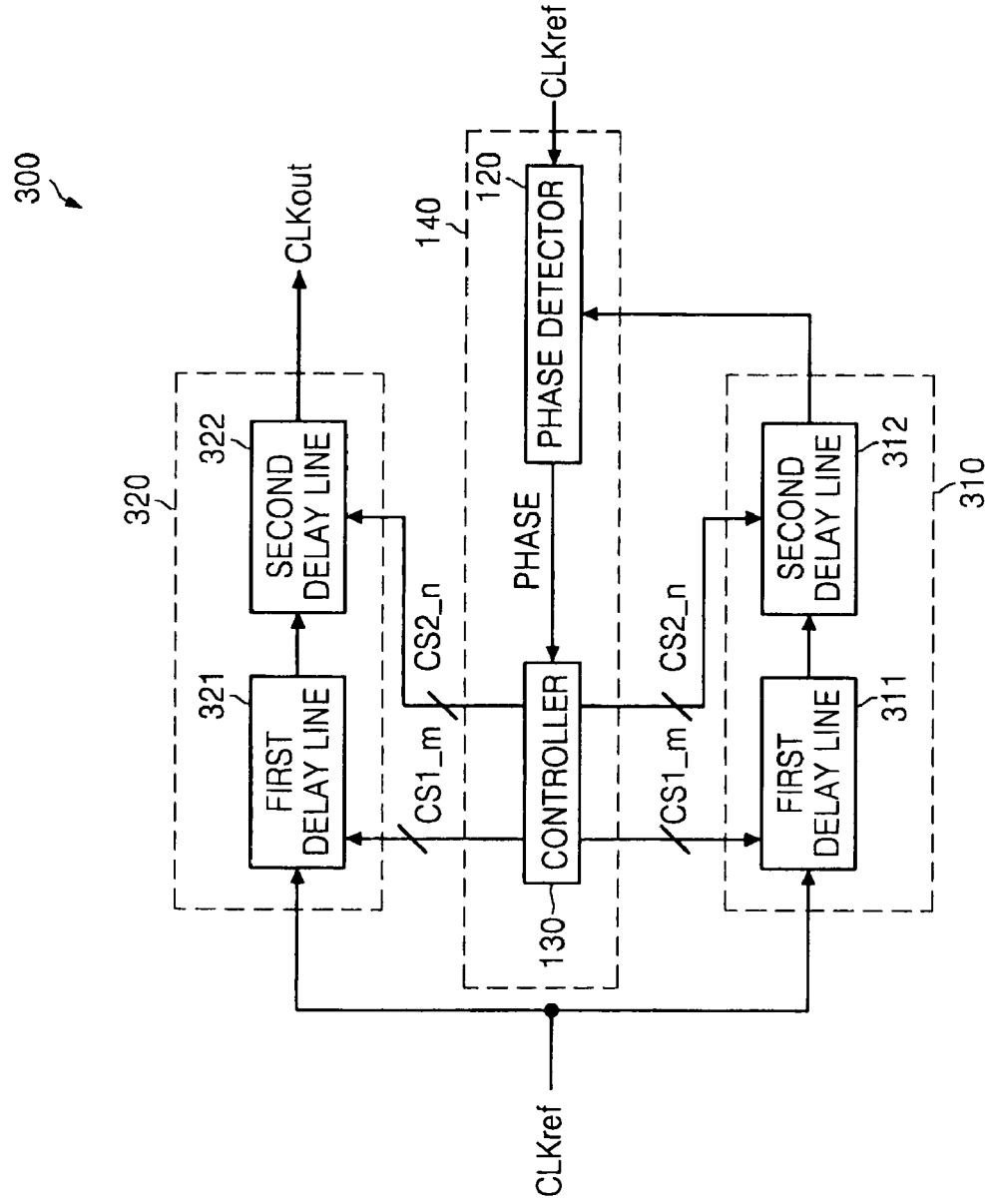

FIG. 13 is a block diagram of a DLL 300 according to another example embodiment of the inventive concepts. The DLL 300 has the same structure as the DLL 100 illustrated in FIG. 1 except for the structure of a delay line. Thus, the difference therebetween will only be described.

The DLL 300 may include a master delay line 310 and a slave delay line 320. The phase difference PHASE, based on which first control signals CS1_m and second control signals CS2_n are generated, may be generated based on a clock generated by the master delay line 310 and a reference clock CLKref. An output clock CLKout may be generated by the slave delay line 320.

The master delay line 310 and the slave delay line 320 may include first delay lines 311 and 321, respectively, and second delay lines 312 and 322, respectively. The first delay lines 311 and 321 may include delay cells (not shown) that do not include a delay control block and the second delay lines 312 and 322 may include both a delay element and a delay control block. The first delay lines 311 and 321 may be controlled by the first control signals CS1_m and the second delay lines 312 and 322 may be controlled by the second control signals CS2_n.

FIG. 14 is a block diagram of a memory device 400 according to an example embodiment of the inventive concept. The memory device 400 may include the DLL 100, a column decoder 410, a row decoder 420, a memory cell array 430, and an input/output (I/O) circuit 440. FIG. 14 is provided to briefly describe that the output clock signal CLKout of the DLL 100 may be used as a timing signal of the memory device 400. Thus, elements such as a controller and a command decoder included in the memory device 400 are not shown. The DLL 100 and CLKref have been described above with reference to FIGS. 1 through 13. Thus, detailed descriptions thereof will be omitted and the features of the memory device 400 including the DLL will be described.

The output clock signal CLKout may be provided as a timing signal for elements of the memory device 400. The memory device 400 may transmit and receive data at high speed based on the output clock signal CLKout of the DLL 100. The column decoder 410 and the row decoder 420 respectively may access a column and a row in the memory cell array 430 in response to an address signal received through an address bus. The I/O circuit 440 may receive data DQ input to the memory device 400 or outputs data DQ to an external device through a data bus.

FIGS. 15A and 15B are diagrams showing an operation of securing a margin between the I/O data DQ of the memory device 400 illustrated in FIG. 14 and the output clock signal CLKout used as a timing clock signal. Referring to FIG. 15A, at time point T1 if an edge of the output clock signal CLKout deviates from the center of the data DQ by more than a predetermined value to the right, the edge of the output clock signal CLKout may be aligned to the center of the data DQ by the delay control operation of the DLL 100. Referring to FIG. 15B, at time point T2 if an edge of the output clock signal CLKout deviates from the center of the data DQ by more than a predetermined value to the left, the edge of the output clock signal CLKout may be aligned to the center of the data DQ by the delay control operation of the DLL 100. Accordingly, the memory device 400 using the output clock signal CLKout of the DLL 100 as a timing signal may transmit and receive data in a state where at least a predetermined margin is always secured.

FIG. 14 shows that the DLL 100 may be used to generate a timing signal for the memory device 400, but the use of example embodiments of the inventive concepts are not restricted thereto. Those of ordinary skill in the art will understand that the DLL 100 according to example embodiments of the inventive concepts may be used in various electronic devices.

The DLL, the memory device and/or the electronic device according to example embodiments of the inventive concepts may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

As described above, according to example embodiments of the inventive concepts, a DLL may compensate for a delay change, which occurs in an output clock signal due to the change of an external environment, by changing a delay value of at least one delay cell without changing the number of delay cells performing a delay operation while the output clock signal that has been through a locking operation is being used by other electronic elements. In addition, according to example embodiments of the inventive concepts, an electronic device can accurately operate using the output clock signal of the DLL.

Figure 16:
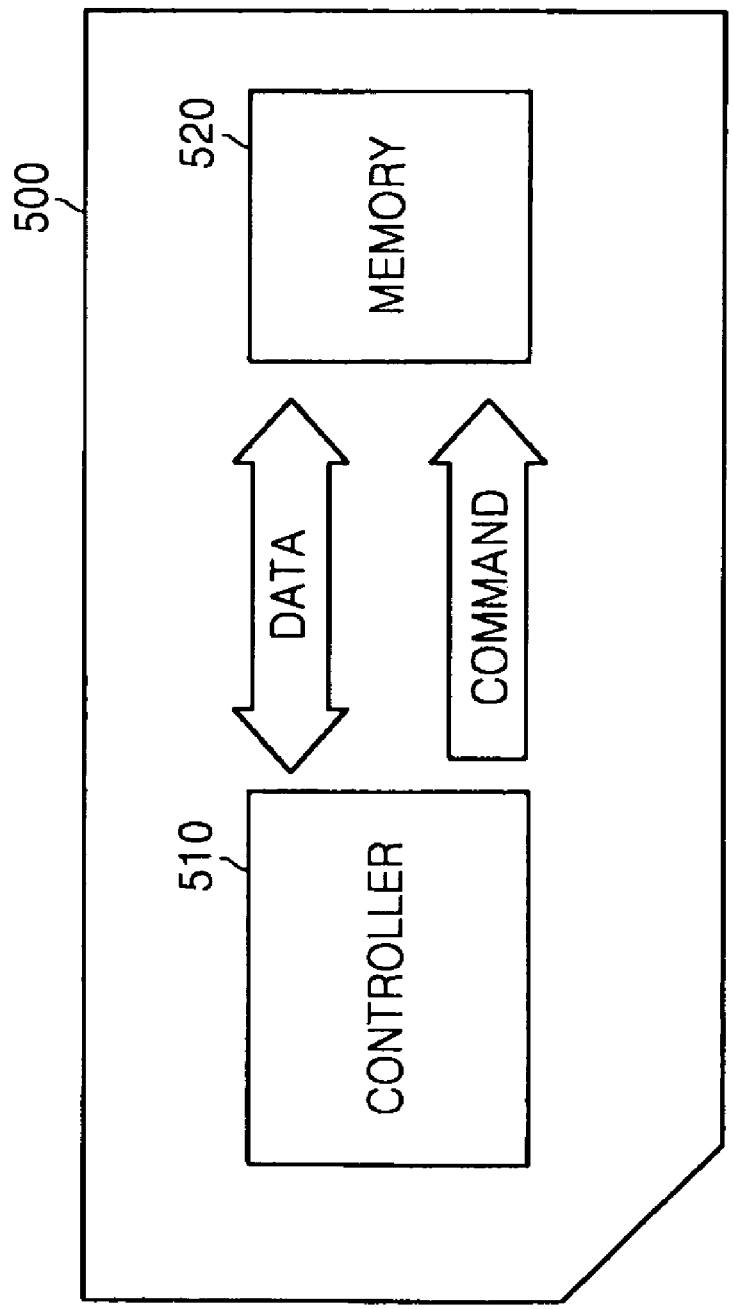

FIG. 16 is a schematic diagram illustrating a memory card 500 according to example embodiments. Referring to FIG. 16, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include the device described above in reference to FIG. 14.

Such a memory card 500 may be used as a storage medium for various portable electronic devices. For example, the memory card 500 may be a multimedia card (MMC) or a secure digital (SD) card.

Figure 17:
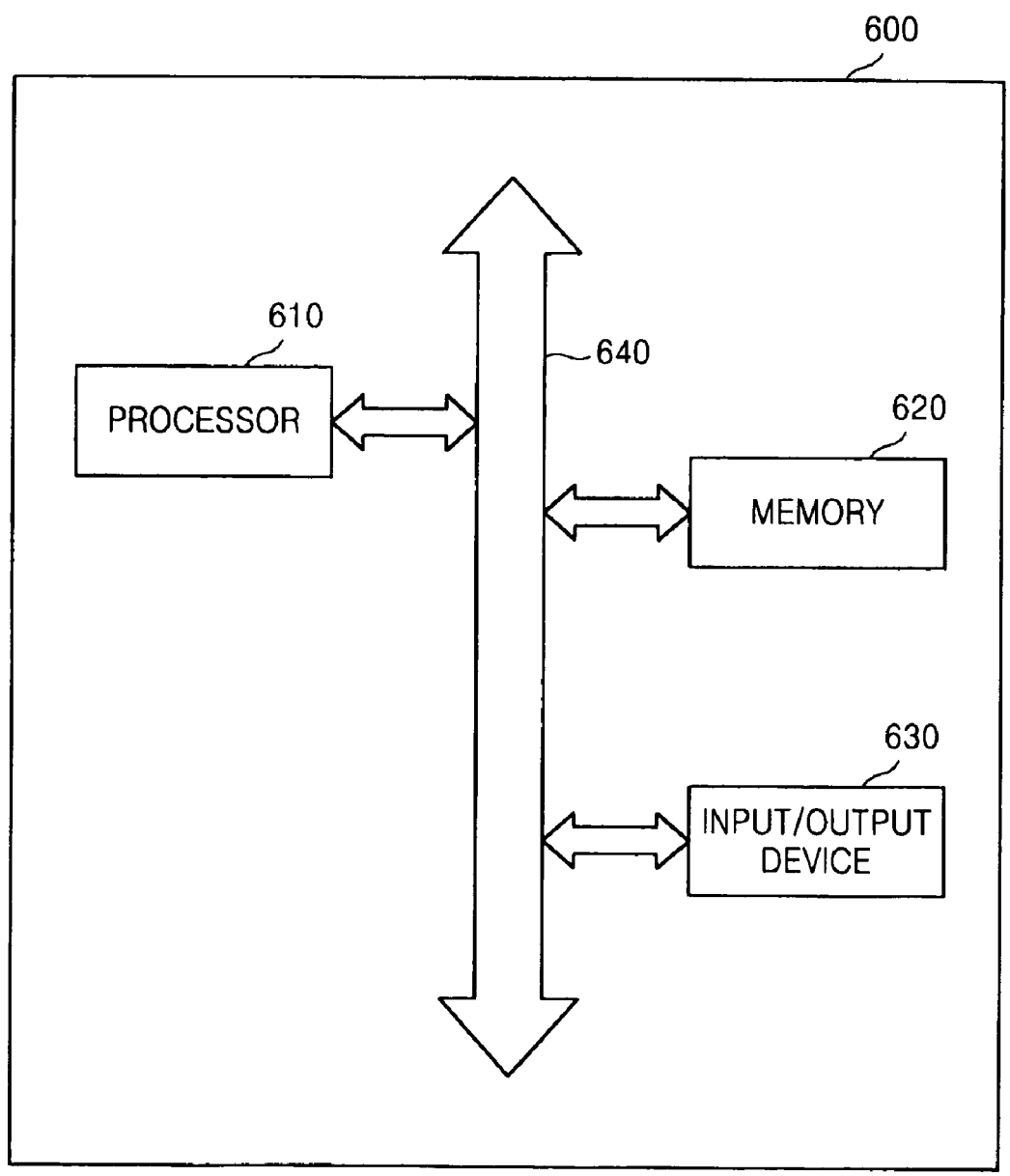

FIG. 17 is a block diagram roughly illustrating an electronic system 600 according to example embodiments. Referring to FIG. 17, a processor 610, an input/output device 630, and a memory 620 may perform data communication with each other by using a bus 640. The processor 610 may execute a program and control the electronic system 600. The input/output device 630 may be used to input/output data to/from the electronic system 600.

The electronic system 600 may be connected to an external device, e.g. a personal computer or a network, by using the input/output device 630 and may exchange data with the external device.

The memory 620 may store codes or programs for operations of the processor 610. For example, the memory 620 may include the non-volatile memory device described above in reference to FIG. 14.

For example, such an electronic system 600 may embody various electronic control systems requiring the memory 620, and, for example, may be used in mobile phones, MP3 players, navigation devices, solid state disks (SSD), or household appliances.

While the present inventive concept has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. A delay locked loop comprising:
a delay line configured to generate an output clock signal based on operations of a plurality of delay cells, the plurality of delay cells configured to delay a phase of a first clock signal;
a phase detection block configured to detect a phase difference between the first clock signal and the output clock signal, and the phase detection block is configured to generate a plurality of first control signals and to generate a plurality of second control signals based on the phase difference;
an inverter configured to invert the first clock signal;
a plurality of first transistors electrically connected between an input terminal of the inverter and a first voltage terminal and each of the plurality of first transistors configured to perform a switching operation in response to one of the first clock signal and a first of the plurality of second control signals, the plurality of first transistors include,
 a first transistor electrically connected between the input terminal of the inverter and a first node and configured to operate in response to a second clock signal output from the inverter,
 a second transistor electrically connected between the first node and a second node and configured to operate in response to the first clock signal, and
 a third transistor electrically connected between the second node and the first voltage terminal and configured to operate in response to the first of the plurality of second control signals; and
a plurality of second transistors electrically connected between an output terminal of the inverter and a second voltage terminal and each of the plurality of second transistors configured to perform a switching operation in response to one of the first clock signal and a second of the plurality of second control signals, the plurality of second transistors include,
 a fourth transistor electrically connected between the output terminal of the inverter and a third node and configured to operate in response to the first clock signal,
 a fifth transistor electrically connected between the third node and a fourth node and configured to operate in response to the second clock signal, and
a sixth transistor electrically connected between the fourth node and the second voltage terminal and configured to operate in response to the second of the plurality of second control signals, wherein
 a number of the plurality of delay cells are configured to generate the output clock signal from the first clock signal in response to the plurality of first control signals during a locking operation and a phase delay value of at least one delay cell of the plurality of delay cells is controlled in response to the plurality of second control signals after the locking operation is completed.

2. The delay locked loop of claim 1, wherein the at least one delay cell comprises:
a delay element configured to delay the phase of the first clock signal; and
a first delay control block configured to control a transition speed of the first clock signal in response to a first of the plurality of second control signals.

3. The delay locked loop of claim 2, wherein the first delay control block includes a first current path between an input terminal of the delay element and a first voltage terminal, the first current path being switched in response to the first of the plurality of second control signals.

4. The delay locked loop of claim 3, wherein the first delay control block includes a plurality of switches electrically connected between the input terminal of the delay element and the first voltage terminal and each of the plurality of switches is configured to operate in response to one of the first clock signal and the first of the plurality of second control signals.

5. The delay locked loop of claim 2, wherein the at least one delay cell further comprises a second delay control block configured to control a transition speed of a second clock signal of an output terminal of the delay element in response to a second of the plurality of second control signals.

6. The delay locked loop of claim 5, wherein the second delay control block includes a second current path between the output terminal of the delay element and a second voltage terminal, the second current path being switched in response to the second of the plurality of second control signals.

7. The delay locked loop of claim 6, wherein the second delay control block includes a plurality of switches electrically connected between the output terminal of the delay element and the second voltage terminal and each of the plurality of switches configured to operate in response to one of the first clock signal and the second of the plurality of second control signals.

8. An electronic device comprising:
the delay locked loop of claim 1; and
an element configured to receive the output clock signal and operate in response to the output clock signal.

9. A delay locked loop comprising:
a plurality of delay cells configured to generate an output clock signal based on a phase delayed first clock signal, a plurality of first control signals and a phase delay value of at least one delay cell of the plurality of delay cells during a locking operation; and
the plurality of delay cells are configured to generate the output clock signal based on the phase delayed first clock signal and a plurality of second control signals after the locking operation is complete, wherein at least one of the plurality of delay cells includes,
a first delay control block configured to control a transition speed of the phase delayed first clock signal in response to a first of the plurality of second control signals, the first delay control block including,
a plurality of switches electrically connected between an input terminal of the plurality of delay cells and a first voltage terminal and each of the plurality of switches is configured to operate in response to one of the phase delayed first clock signal and the first of the plurality of second control signals, the plurality of switches including,
a first transistor electrically connected between an input terminal of an inverter and a first node and configured to operate in response to a second clock signal output from the inverter, the inverter being electrically connected to the input terminal of the plurality of delay cells,
a second transistor electrically connected between the first node and a second node and configured to operate in response to the phase delayed first clock signal, and
a third transistor electrically connected between the second node and the first voltage terminal and configured to operate in response to the first of the plurality of second control signals.

10. The delay locked loop of claim 9, wherein at least one of the plurality of delay cells further comprises:
a second delay control block configured to control a transition speed of a second clock signal of an output terminal of the plurality of delay cells in response to a second of the plurality of second control signals.

11. The delay locked loop of claim 10, wherein the second delay control block includes a plurality of switches electrically connected between an input terminal of the plurality of delay cells and a second voltage terminal and each of the plurality of switches is configured to operate in response to one of the phase delayed first clock signal and the second of the plurality of second control signals.

12. The delay locked loop of claim 11, wherein the plurality of switches comprise:
a first transistor electrically connected between an output terminal of an inverter and a first node and configured to operate in response to the phase delayed first clock signal, the inverter being electrically connected to the input terminal of the plurality of delay cells;
a second transistor electrically connected between the first node and a second node and configured to operate in response to a clock signal output from the inverter; and
a third transistor electrically connected between the second node and the second voltage terminal and configured to operate in response to the second of the plurality of second control signals.

13. The delay locked loop of claim 9, further comprising:
a phase detection block configured to generate the plurality of first control signals and the plurality of second control signals based on a detected phase difference between the phase delayed first clock signal and the output clock signal.

14. The delay locked loop of claim 9, wherein
if the detected phase difference is not within a set range the locking operation is one of started and continued, and
if the detected phase difference is within the set range the locking operation is complete.

15. A memory card comprising:
a memory module;
a controller configured to control the memory module;
a bus configured to exchange electrical signals between the controller and the memory module; and
a delay locked loop configured to provide an output clock signal to at least one of the memory module and the controller, the delay locked loop including,
a delay line configured to generate the output clock signal based on operations of a plurality of delay cells, the plurality of delay cells configured to delay a phase of a first clock signal, and a phase detection block configured to detect a phase difference between the first clock signal and the output clock signal and the phase detection block configured to generate a plurality of first control signals and to generate a plurality of second control signals based on the phase difference, wherein a number of the plurality of delay cells are configured to generate the output clock signal from the first clock signal in response to the plurality of first control signals during a locking operation and a phase delay value of at least one delay cell of the plurality of delay cells is controlled in response to the plurality of second control signals after the locking operation is completed.

16. An electronic system comprising:
a processor;
an input/output device; and
the memory card of claim 15.

* * * * *